United States Patent
Klages et al.

(12) 
(10) Patent No.: US 6,274,403 B1
(45) Date of Patent: Aug. 14, 2001

(54) PROCESS FOR PRODUCING HETEROPITAXIAL DIAMOND LAYERS ON SI-SUBSTRATES

(75) Inventors: Claus-Peter Klages, Hamburg; Xin Jiang, Pinneberg; Hans-Jürgen Füsser, Gerstetten-Dettingen; Martin Hartweg, Erbach; Reinhard Zachai, Gunzburg; Manfred Rösler, Ulm, all of (DE)

(73) Assignee: Daimler Benz AG, Stuttgart (DE)

( * ) Notice: Subject to any disclaimer, the term of this patent is extended or adjusted under 35 U.S.C. 154(b) by 0 days.

(21) Appl. No.: 08/411,762

(22) PCT Filed: Oct. 1, 1993

(86) PCT No.: PCT/DE93/00936
 § 371 Date: Jul. 17, 1995
 § 102(e) Date: Jul. 17, 1995

(87) PCT Pub. No.: WO94/08076
 PCT Pub. Date: Apr. 14, 1994

(30) Foreign Application Priority Data
 Oct. 1, 1992 (DE) .............................................. 42 33 085

(51) Int. Cl.⁷ .................................................. H01L 31/0312
(52) U.S. Cl. ............................ 438/105; 257/77; 257/627
(58) Field of Search ............................ 257/628, 77, 627; 437/126, 131; 427/459, 461, 532, 585, 593

(56) References Cited

U.S. PATENT DOCUMENTS

| | | |
|---|---|---|
| 4,870,030 | 9/1989 | Markunas et al. . |
| 5,015,528 | 5/1991 | Pinneo . |
| 5,236,545 * | 8/1993 | Pryor ..................... 156/613 |
| 5,397,428 * | 3/1995 | Stoner et al. ............ 117/86 |
| 5,442,199 * | 8/1995 | Saito et al. .............. 257/77 |
| 5,458,733 * | 10/1995 | Tessmer et al. ........ 216/67 |
| 5,491,348 * | 2/1996 | Koyamamo et al. .... 257/77 |
| 5,512,873 * | 4/1996 | Saito et al. .............. 257/77 |
| 5,562,769 * | 10/1996 | Dreifus et al. .......... 117/86 |

FOREIGN PATENT DOCUMENTS

| | | |
|---|---|---|
| 63-210099 | 8/1988 | (JP) . |
| 2-283697 | 4/1989 | (JP) . |
| 3-165064 | 7/1991 | (JP) . |

OTHER PUBLICATIONS

Narayan, Srivatra, Peters, Yokota and Ravi, Applied Physics Letters, vol. 53, pp. 1823–1825 (1988).
Jeng, Tuan, Salat and Fricano, Applied Physics Letters, vol. 56, p. 1968–1970 (1990).
Koizumi, Murakami, Inuzuka and Suzuki, Applied Physics Letters, vol. 57, pp. 563–565 (1990).
Yugo, Kanai, Kimura and Muto, Applied Physics Letters, vol. 58, pp. 1036–1038 (1991).
Stoner and Glass, Applied Physics Letters, vol. 60, pp. 698–700 (1992).
Aslam, Taher, Masood, Tamor and Potter, Applied Physics Letters, vol. 60, pp. 2923–2925 (1992).
Geis, Rathman, Ehrlich, Murphy and Lindley, IEEE Electron Device Letters, vol. EDL–8, pp. 341–343 (1987).
Geis, Efremow and Rathman, Journal of Vacuum Science and Technology A, vol. 6, pp. 1953–1954 (1988).
Wang, Liao and Gao, Physica Status Solidi (A) Applied Research, vol. 128, pp. 83–87 (1991).
Stoner, Ma, Wolter and Glass, Physical Review B, vol. 45, pp. 11067–11087 (1992).
Zhu, Stoner, Williams and Glass, Proceedings of the IEEE, vol. 79, pp. 621–646 (1991).

* cited by examiner

Primary Examiner—Minh Loan Tran
(74) Attorney, Agent, or Firm—Barnes & Thornburg

(57) ABSTRACT

The invention relates to a method for producing heteroepitaxial diamond layers on Si-substrates by means of CVD and standard process gases, in which
(a) during the nucleation phase a negative bias voltage is applied to the Si-substrate and
(b) following the nucleation phase diamond deposition takes place.

22 Claims, 5 Drawing Sheets

(110)

(100)

PROCESS FOR PRODUCING HETEROEPITAXIAL DIAMOND LAYERS ON SI-SUBSTRATES

BACKGROUND OF THE INVENTION

The invention relates to a method for producing heteroepitaxial diamond layers from the vapor phase on a silicon substrate, as well as to layers produced by this method and the use thereof.

As is known from M. W. Geis et al, IEEE Electron Device Letters EDL-8, 1987, 341 and M. W. Geis et al, J. Vac. Sci. Technol., A 6, 1988, 1953, as a result of its excellent physical properties such as

| | |
|---|---|
| band gap | 5.5 eV |
| hole mobility | 1800 cm$^2$/V$_s$ |
| electron mobility | 2000 cm$^2$/V$_s$ |
| electron saturation drift rate | 2 × 10$^7$ cm/s |
| disruptive field | 1 × 10$^7$ V/cm |
| thermal conductivity | 20 W/cmK |
| relative permativity | 5.7 | diamond is an excellent material, which is suitable for high temperature, high frequency and high power semiconductor components.

After Japanese scientists described at the beginning of the 1980's that diamond can be synthesized as a layer or coating from gaseous substances, numerous efforts were made throughout the world to find new applications for this promising material with its great technological potential.

The efforts to use CVD-diamond as an active or passive electronic material have failed up to now because it has not been possible to heteroepitaxially deposit diamond from the most standard substrate, namely silicon. However, epitaxy is the prerequisite for obtaining electrical characteristics as are expected of such layers. In order to develop and test new solutions for this problem, numerous developments have been made in the past. Only localized epitactic growth has been obtained on silicon substrates (D. G. Jeng, H. S. Tuan, R. F. Salat and G. J. Fricano, Appl. Phys. Lett. 56, 1968 (1990); J. Narayan, A. R. Srivatra, M. Peters, S. Yokota and K. V. Ravi, Appl. Phys. Lett. 53, 1823, (1988)). Although heteroepitaxy is successful on C-BN, this is only so on particles, because at present it is not possible to produce a crystalline, large-surface C-BN (S. Koizumi, T. Murakami and T. Inuzuka and K. Suzuki, Appl. Phys. Lett. 57, 563 (1990)). On silicon carbide (1-wafer), a carrier material which is very difficult to produce, only a partially oriented growth of diamond (50% of the grown crystals) has been performed with bias nucleation (B. R. Stoner and J. T. Glass, Appl. Phys. Lett. 60, 698 (1992)).

Of late further publications have appeared which deal with this problem.

In physical review B V. 45, no.19, p.11067ff, Stoner et al reported on the deposition of diamond on Si. The procedure was such that a two-stage process is proposed, involving a pretreatment (nucleation) accompanied by the application of a negative bias voltage in the case of a 2% methane/hydrogen plasma. This was followed by a growth phase while maintaining the bias voltage. The crystallites in the layers obtained have a random orientation.

The working group of Yugo et al (Appl. Phys. Lett. 58 (10), p.1036ff) have also proposed a two-stage process. The first stage is performed accompanied by the application of a negative bias voltage with a CH$_4$/H$_2$ plasma, the methane proportion being 40%. The diamond deposition is carried out without bias under "normal" conditions (approx. 0.5% methane in H$_2$). However, this process leads to randomly oriented, polycrystalline layers and not to heteroepitaxial layers.

Thus, no method is known which makes it possible to heteroepitaxially deposit diamond on the most widespread substrate, namely Si.

SUMMARY OF THE INVENTION

Therefore the problem of the present invention is to provide a method for the production of heteroepitaxial diamond layers on silicon substrates.

With regards to the method, this problem is solved by the characterizing features of claim 1 and with regards to the layers by the features of claim 11. The subclaims give advantageous further developments.

As compared with diamond, silicon has widely differing lattice parameters and a low surface energy, it is not possible under normal conditions to form a high nucleus density on not pretreated silicon and thereby achieve diamond deposition.

Surprisingly and unexpectedly on the basis of the hitherto known results, it has been found that through a planned pretreatment of the Si substrate, an excellently oriented diamond nucleation is achieved without any mechanical diamond prenucleation.

The invention proposes a three-stage process. In the first stage the Si-surface is pretreated. Preferably the procedure is such that there is either a cleaning or purification in ultra-high vacuum at <10$^{-9}$ mbar, which requires a substrate temperature of >950° C., or a plasma cleaning takes place with H$_2$ with or without a bias voltage. This is followed by nucleation and diamond growth.

It has proved important that prior to the nucleation phase said pretreatment is performed in order to remove from the Si-surface impurities and in particular oxides and/or oxygen compounds. This is achieved according to the first variant (high vacuum) by a desorption of the impurities and in the second variant by H$_2$ plasma treatment.

It has been found that very brief pretreatments (a few seconds) can be adequate

It is advantageous if the pretreatment (Si-surface cleaning) in the case of plasma treatment takes place at 300 to 1100° C. with an almost 100% H$_2$ plasma. When applying a bias voltage it is preferable to work at +50 to −300 V and particular preference is given to −50 V.

In the case of the plasma pretreatment it is sufficient if first a pure H$_2$ plasma is ignited and immediately following this (i.e. after a few seconds) the nucleation phase is performed.

In the method according to the invention, it is particularly advantageous if during plasma cleaning a negative bias voltage is also applied to the substrate. This development of the invention also favors the subsequent nucleation.

The method according to the invention can be performed with all standard process gases. The following process gases can be used: CO+CH$_4$, C$_2$H$_5$OH, acetylene and acetone or e.g. CF$_4$ and methane. According to a particularly preferred embodiment of the invention methane and hydrogen are used as process gases.

In the case of CH$_4$/H$_2$ it has also proved advantageous if the negative bias during nucleation is in the range 60 to 300 V, preferably approximately 150 V and a 0.1 to 10% process gas flow of methane in hydrogen is supplied. Particular preference is given to a 0.2 to 2% process gas flow.

The growth phase is then performed without applying a bias voltage under known conditions. It is advantageous to have substrate temperatures of 400 to 1100° C. and a 0.1 to 10% process gas flow of $CH_4$ in $H_2$. As for nucleation, it is preferable to work with a 0.2 to 2% process gas flow.

According to the invention the desired nucleus density can be chosen over the nucleation phase duration. The desired thickness of the diamond layer can be varied as a function of the deposition period.

Thus, compared with the prior art, the method according to the invention leads to important advantages.
1. As a result of the pretreatment according to the invention Si-surfaces are effectively cleaned, so that during the second stage oriented nuclei can be produced on the silicon.
2. Compared with most other materials silicon is the basic material for modern microelectronics. Thus, as a result of the method according to the invention completely new application possibilities are provided and layers can be produced, whose electrical properties are close to those of perfect diamond monocrystals.
3. The method according to the invention makes it possible to perform the surface cleaning of substrates, nucleation and the growth of the diamond layers in a single process.

The layers produced with the method according to the invention are characterized in that the individual crystallites have edge dimensions of 0.1 to 100 $\mu$m and are oriented to 20 to 100% on the Si-substrate lattice. The method is preferably used for (100), (111) or (110)-oriented Si-substrates.

The orientation is in particular such that within the framework of a possible misorientation of less than 10°, corresponding crystal orientations <hkl> in the substrate and in the crystallites are parallel to one another.

This opens the door to completely new applications, such as the use as heat-conducting, insulating layers (power semi-conductors, laser diodes, etc.) or as a heat-conducting layer with a high electrical resistance and a high disruptive field for cooling semiconductor components. Other possible uses are as optical windows with a high mechanical stability and low absorption as well as as an active semiconductor material in electronic components and as a piezoresistive sensor or thermistor.

DESCRIPTION OF THE DRAWING

The invention is described in greater detail hereinafter relative to an embodiment and the attached drawings, wherein show.

DETAILED DESCRIPTION OF THE INVENTION

Figure 1:
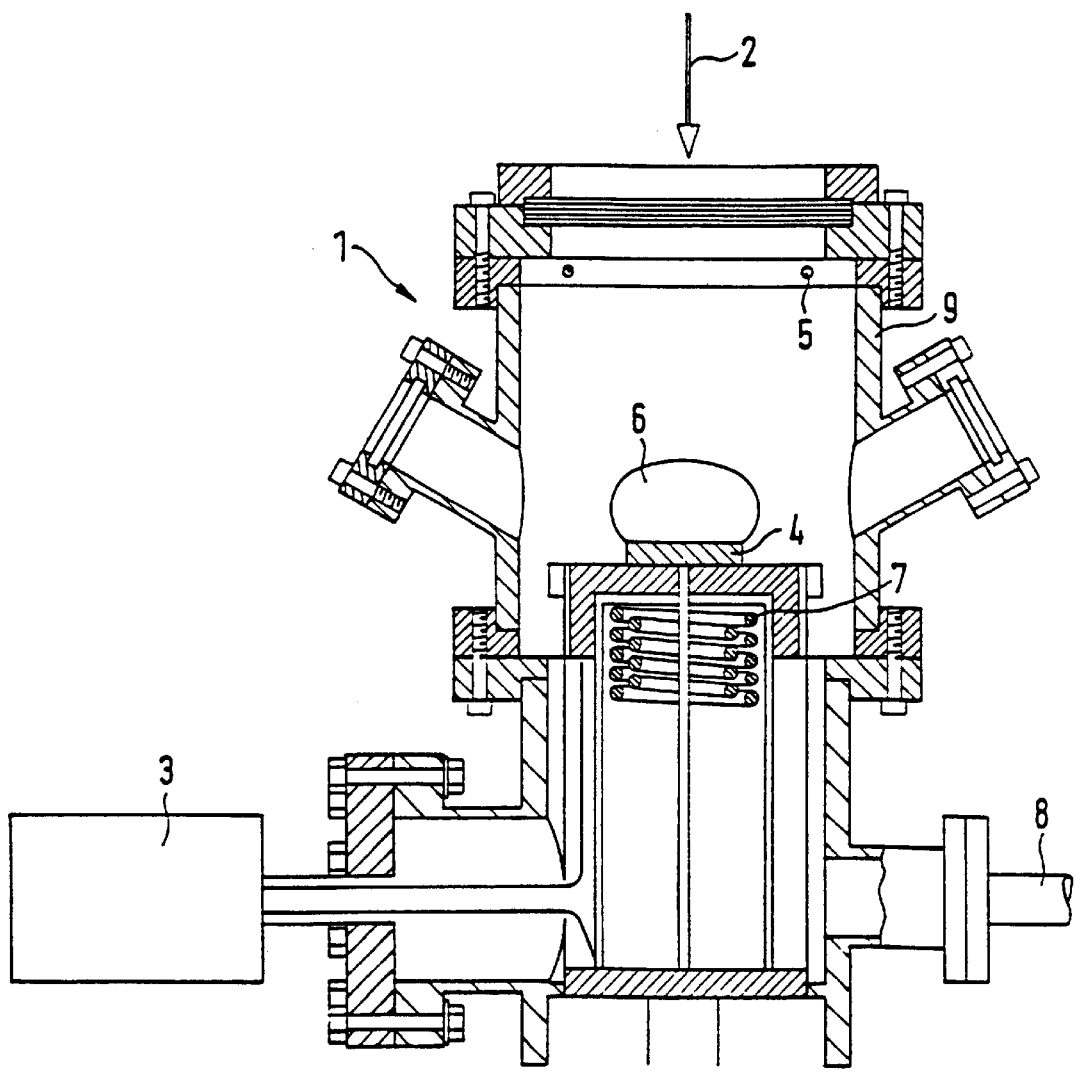
FIG. 1 An exemplified test setup.

FIG. 1 shows an exemplified test setup. Use is made in the present embodiment of a MWPCVD unit 1, which has a microwave generator with an adjustable microwave power of up to 1.5 kW for producing a microwave 2. According to the invention the MWPCVD unit is provided with a d.c. bias voltage supply 3, which is adjustable up to ±300 V.

In each test, prior to the deposition experiment, a (100) silicon substrate 4 was cleaned in an acetone ultrasonic bath. After positioning the substrate 4 in the reactor 1 the vacuum chamber is evacuated to $10^{-2}$ mbar and the substrate heated. The process gases are then supplied via the gas supply 5 and the plasma 6 is ignited. The reactor is heated by means of the heating system 7. The vacuum is produced by means of the pump connection 8. A water cooling system 9 is provided for cooling purposes.

The layer production method takes place according to the invention in the three following stages:
1. plasma cleaning of the substrate surfaces,
2. diamond nucleation with the aid of the substrate bias voltage,
3. diamond growth.

Table 1 gives the parameters for the three stages. The diamond layer thickness is controlled by the deposition time. As a function of the sought nucleus density, diamond nucleation takes place in a time period of approximately 2 to 200 min.

TABLE 1

|  | Plasma cleaning | Nucleation | Diamond Deposition |
|---|---|---|---|
| $H_2$ | 100 vol. % | 80–99 vol. % | 95–99.8 vol. % |
| $CH_4$ | 0 vol. % | 0.5–20.0 vol. % | 0.2–5 vol. % |
| Temp. | 300–1100° C. | 400–1000° C. | 400–1000° C. |
| Power | 500–1500 W | 500–1500 W | 500–1500 W |
| Pressure | 10–100 mbar | 10–100 mbar | 10–100 mbar |
| Bias | −50 V | −50 to −300 V | 0 V |

Figure 2A:
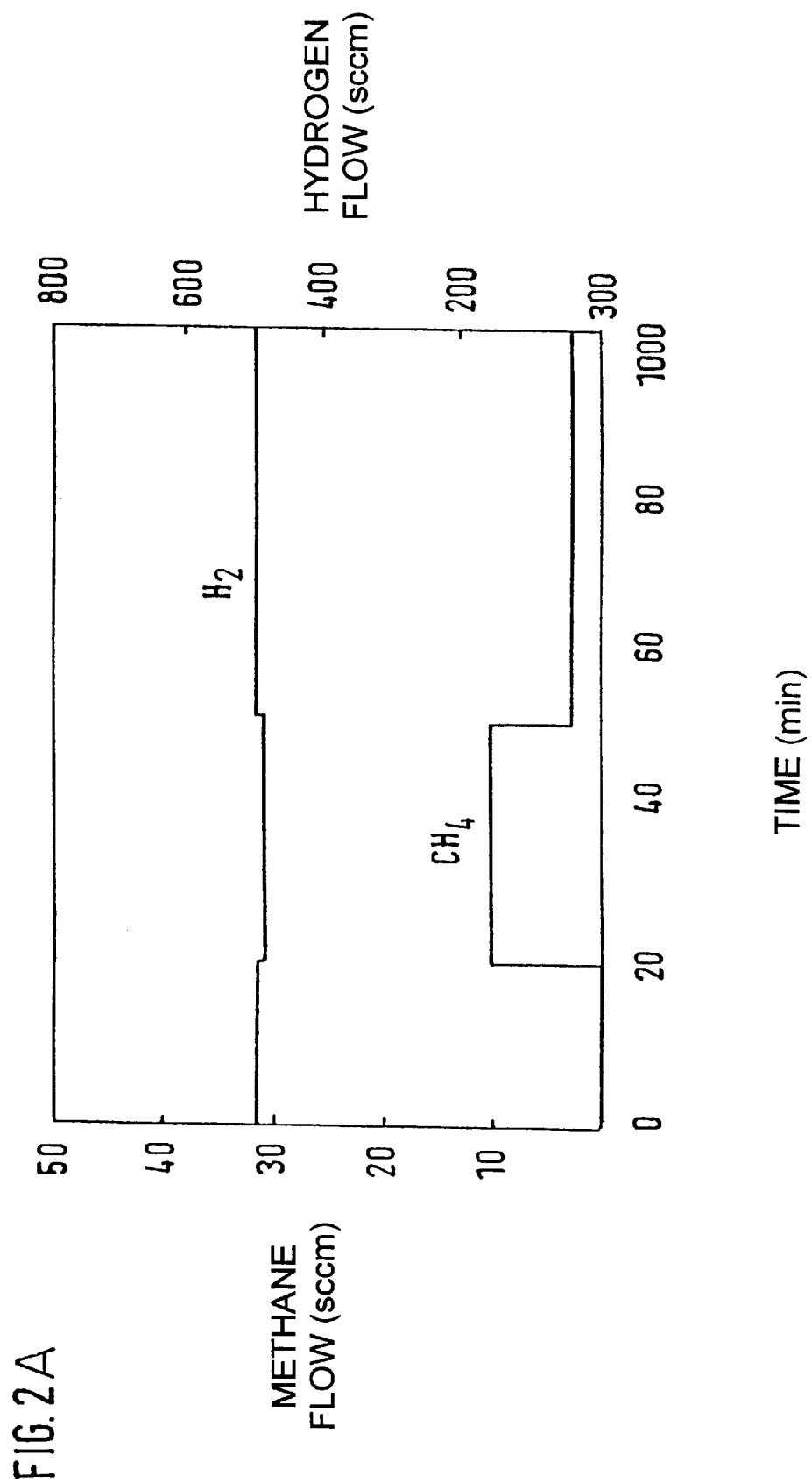
FIGS. 2A–B typical process sequence.
Figure 2B:
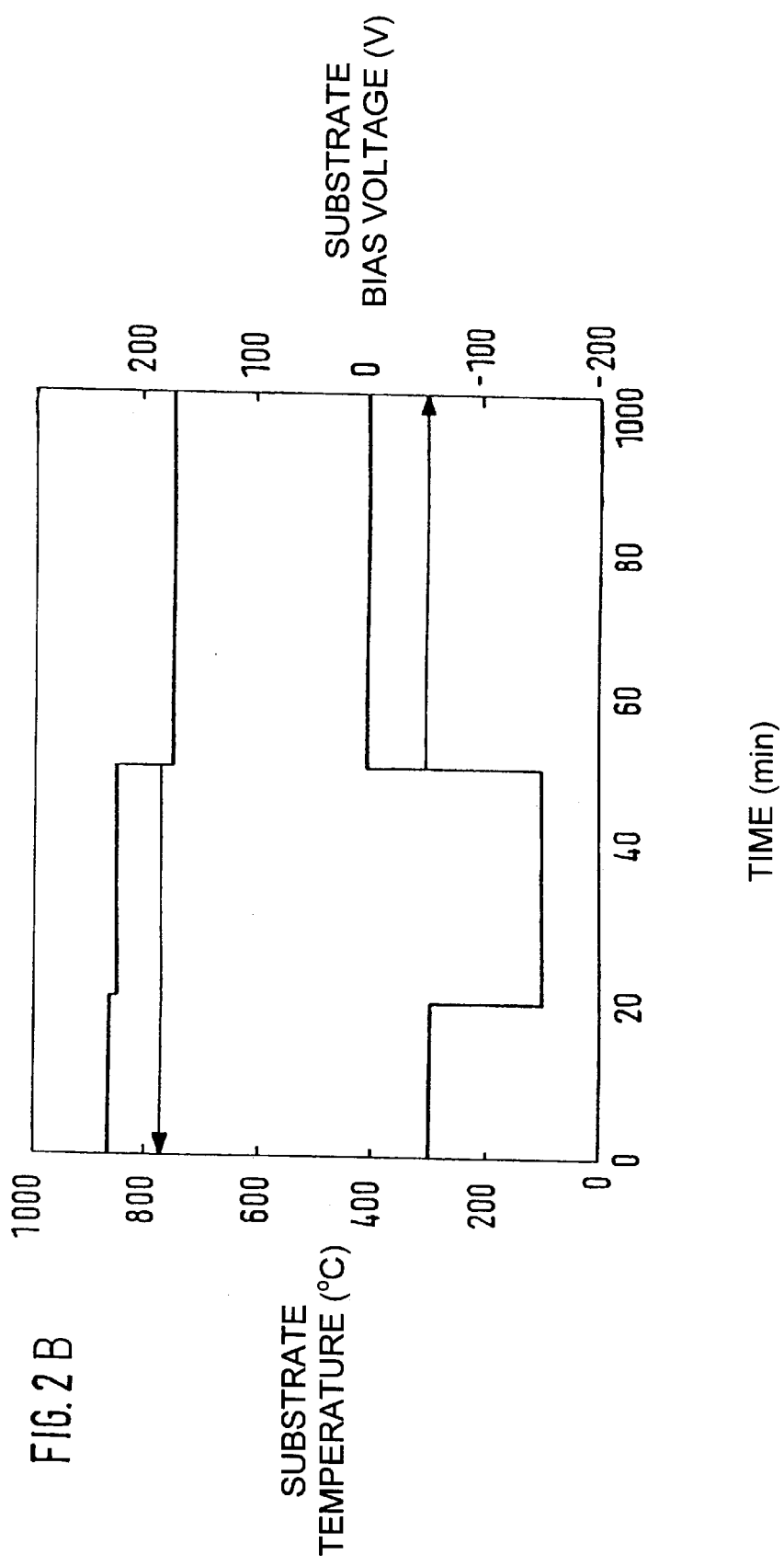

The typical process sequence for the method according to the invention using the apparatus of FIG. 1 is shown in FIGS. 2A–B. FIG. 2B shows the substrate temperature gradient, as well as the substrate bias voltage for a time of 0 to 1000 min. In the present case the time phase for plasma cleaning is 20 min. FIGS. 2A–2B clearly show that during this time the substrate bias voltage is −50 V and the methane flow is 0, whereas the hydrogen flow is approximately 500 sccm. As during this time phase the methane flow is 0, there is a 100% hydrogen volume.

Subsequently the negative bias voltage is raised to −150 V and simultaneously a methane flow of approximately 200 sccm is set and the hydrogen flow is slightly produced, so that the hydrogen volume proportion is 80 to 99 vol. % and the methane volume proportion 0.5 to 20 vol. %. The substrate temperature is correspondingly adjusted.

At the end of this 30 minute nucleation phase, the diamond deposition time phase commences. The bias voltage is taken from the substrate and is consequently 0 from this time.

Simultaneously the hydrogen volume flow is decreased to permit a continuous growth of the layer.

The layers are characterized by X-ray diffraction, pole figure analysis and SEM. The results show that the layers consist of a diamond phase.

Figure 3:
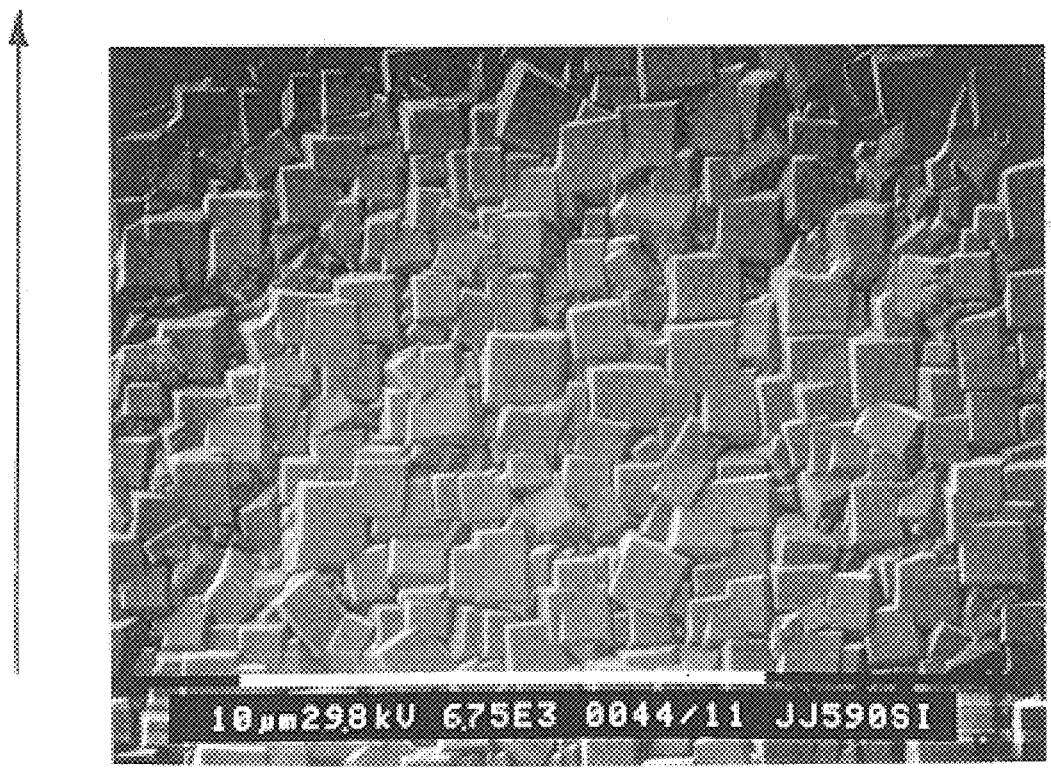
FIG. 3 A scanning electron micrograph of the layer produced according to the invention.

FIG. 3 shows a scanning electron micrograph of a layer produced according to the invention following a 20 hour deposition period. The scanning electron micrograph makes it clear that 80 to 90% of the crystallites are oriented. Pole figure analysis established that the diamond crystals have the following relationships with the substrate:

(001)diamond||(001)silicon

[011]diamond||[011]silicon

Only reflections of diamond and silicon were detected by X-ray diffraction.

Figure 4:
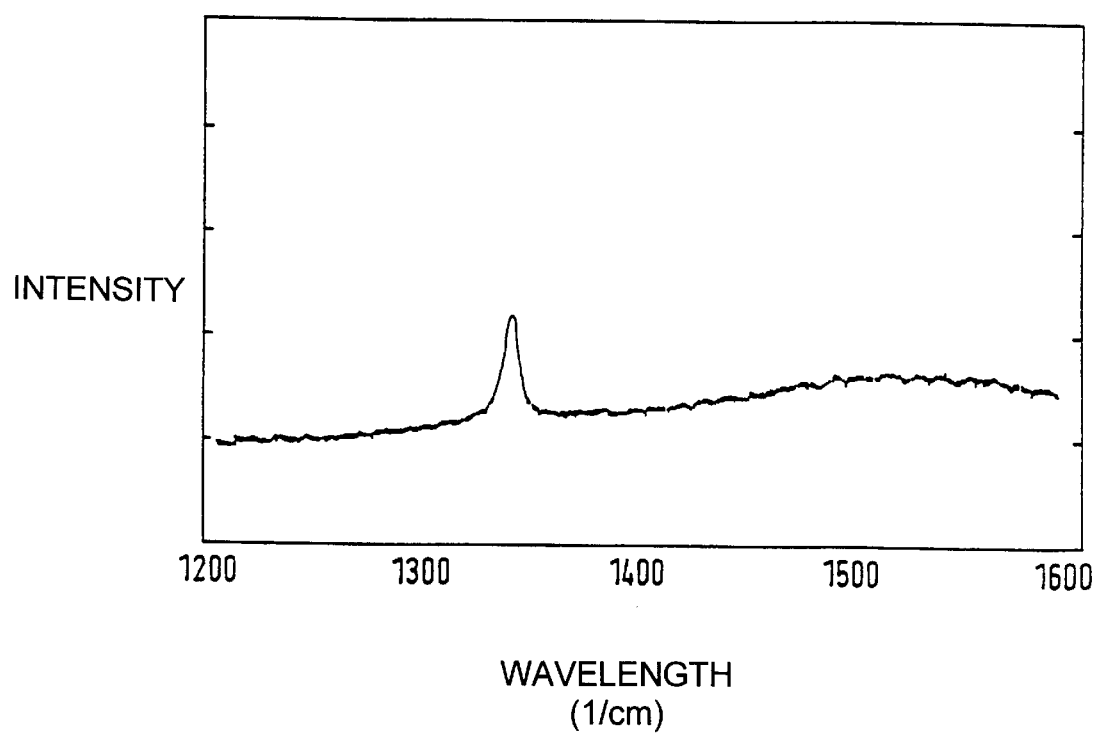
FIG. 4 The Raman spectrum of the surface.

FIG. 4 shows a Raman spectrum of the layer. The diamond line is clearly visible at 1335 $cm^{-1}$.

Thus, using the method according to the invention heteroepitaxial diamond layers can be deposited on silicon, which opens a wide range of possibilities.

What is claimed is:

1. A process for producing heteroepitaxial diamond layers on Si-substrates by CVD, in which standard process gases are supplied to a reactor provided with a heated Si-substrate, comprising,
   (a) pretreating a surface of the Si-substrate by applying a vacuum and heating the Si-substrate to temperatures between 300 and 1100° C.,
   (b) performing a nucleation phase with the application of a bias voltage in the range −60 to −300 V at a substrate temperature of 400 to 1100° C., and
   (c) removing the bias voltage and performing diamond deposition directly onto the surface of the Si-substrates.

2. The process according to claim 1, wherein the pretreatment is performed in ultra-high vacuum at <$10^{-9}$ mbar and at a temperature above 950°.

3. The process according to claim 1, wherein the pretreatment comprises plasma cleaning with hydrogen with a hydrogen proportion higher than 95%, the substrate temperature being in the range 600 to 1100° C.

4. The process according to claim 3, wherein plasma cleaning takes place accompanied by the simultaneous application of a bias voltage of +50 to −300 V.

5. The process according to claim 4, wherein the bias voltage is approximately −50 V.

6. The process according to claim 1, wherein the process gas is $CH_4/H_2$.

7. The process according to claim 6, wherein during the nucleation phase (method stage b) the bias voltage is approximately −150 V and a 0.1 to 10% process gas flow of methane in hydrogen is used.

8. The process according to claim 6, wherein during diamond deposition (method stage c) the temperature of the Si-substrate is in the range 400 to 1100° C. and a 0.1 to 10% process gas flow of methane in hydrogen is used.

9. The process according to claim 1, wherein a desired nucleus density determines the duration of a nucleation phase of the process.

10. The process according to claim 1, wherein a deposition time determines a thickness of the diamond layer.

11. The process according to claim 1, wherein the heteroepitaxial diamond layers are grown on (100)-oriented Si-substrates.

12. The process according to claim 1, wherein the heteroepitaxial diamond layers are grown on (110)-oriented Si-substrates.

13. The process according to claim 1, wherein the heteroepitaxial diamond layers are grown on (111)-oriented Si-substrate.

14. The process according to claim 1, wherein crystallites with edge dimensions of 0.1 to 100 μm are present in the heteroepitaxial diamond layers.

15. The process according to claim 1 wherein a misorientation between a first crystal orientation ($h_1k_1l_1$) of the Si-substrate and a second crystal orientation ($h_2k_2l_2$) of crystallites produced on the Si-substrate is less than 10%.

16. A heat conducting, electrically insulating layer made by the process of claim 11, 12 or 13.

17. An optical window made by the process of claim 11, 12 or 13.

18. An active semiconductor material made by the process of claim 11, 12 or 13.

19. A piezoresistive sensor made by the process of claim 11, 12 or 13.

20. A thermistor made by the process of claim 11, 12 or 13.

21. The process according to claim 1 or 13 wherein 20 to 100% of the crystallites present in the heteroepitaxial diamond layers are oriented on the lattice of the Si-substrate.

22. A process for producing heteroepitaxial diamond layers on Si-substrates by CVD in a reactor chamber comprising pretreating a surface of the Si-substrates by applying a vacuum and heating the Si-substrates to temperatures between 300 and 1100° C., performing a nucleation phase with the application of a bias voltage in the range −60 to −300 V at a substrate temperature between 400 and 1100° C., removing the bias voltage, and performing a diamond deposition directly onto the surface of the Si-substrates, the Si-substrates remaining in the reactor chamber during all of the steps.

* * * * *